(12) United States Patent
Lee et al.

(10) Patent No.: US 10,057,093 B2
(45) Date of Patent: Aug. 21, 2018

(54) USING COMMON MODE LOCAL OSCILLATOR TERMINATION IN SINGLE-ENDED COMMUTATING CIRCUITS FOR CONVERSION GAIN IMPROVEMENT

(71) Applicant: International Business Machines Corporation, Armonk, NY (US)

(72) Inventors: Wooram Lee, Briarcliff Manor, NY (US); Jean-Olivier Plouchart, New York, NY (US); Alberto Valdes Garcia, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/197,058

(22) Filed: Jun. 29, 2016

(65) Prior Publication Data

US 2018/0006855 A1   Jan. 4, 2018

(51) Int. Cl.
*H04L 27/20* (2006.01)
*H03C 3/02* (2006.01)
*H03D 7/12* (2006.01)

(52) U.S. Cl.
CPC .......... *H04L 27/20* (2013.01); *H03C 3/02* (2013.01); *H03D 7/12* (2013.01)

(58) Field of Classification Search
CPC . H03C 3/02; H03D 7/12; H03D 7/125; H04L 27/20
USPC ........ 327/355, 356, 359; 455/118, 313, 323, 455/325, 333
See application file for complete search history.

(56) References Cited

U.S. PATENT DOCUMENTS

| | | | |
|---|---|---|---|
| 5,263,198 A | 11/1993 | Geddes et al. | |
| 5,634,207 A | 5/1997 | Yamaji et al. | |
| 6,922,108 B2 | 7/2005 | Lin | |
| 8,385,873 B2 | 2/2013 | Zhou et al. | |
| 8,803,586 B1 | 8/2014 | Lee et al. | |
| 8,937,514 B2 | 1/2015 | Cavus et al. | |
| 8,963,612 B1 | 2/2015 | Wyse et al. | |
| 2002/0111152 A1* | 8/2002 | Razavi | H03D 7/1441 455/326 |
| 2003/0199259 A1* | 10/2003 | Macedo | H03D 7/1425 455/141 |
| 2004/0160264 A1* | 8/2004 | Kim | H03F 3/45089 327/355 |
| 2005/0064840 A1* | 3/2005 | Heydari | H03D 7/1441 455/323 |
| 2008/0169859 A1 | 7/2008 | Garcia et al. | |

(Continued)

FOREIGN PATENT DOCUMENTS

JP   3566500 B2   9/2004

*Primary Examiner* — William Hernandez
(74) *Attorney, Agent, or Firm* — Cantor Colburn LLP; Keivan Razavi

(57) ABSTRACT

A commutating circuit includes a single-ended mixer and a passive network. The single-ended mixer includes a differential local oscillator terminal. The passive network includes a plurality of inductors and a capacitor. The plurality of inductors can be coupled to the differential local oscillator terminal. The plurality of inductors can provide an impedance in accordance with a common mode or a differential mode. The commutating circuit can be implemented via a device, a system and/or a method.

17 Claims, 7 Drawing Sheets

(56) References Cited

U.S. PATENT DOCUMENTS

2015/0137869 A1* 5/2015 Akizuki .............. H03D 7/1458
327/359

* cited by examiner

USING COMMON MODE LOCAL OSCILLATOR TERMINATION IN SINGLE-ENDED COMMUTATING CIRCUITS FOR CONVERSION GAIN IMPROVEMENT

BACKGROUND

Embodiments of the present disclosure relate in general to processing signals for transmission, and more specifically to circuits, systems and methodologies for efficiently and effectively improving a conversion gain of mixer circuitry used in the wireless transmission and/or reception of information signals.

In general, commutating circuits such as mixers and modulators enable frequency conversion for signal processing at a different frequency from the original signal frequency. One useful example of commutating circuits is a radio frequency (RF) mixer popularly used in a variety of radio-frequency/microwave applications, including military radar, cellular base stations, and the like. When sending information wirelessly through air, a mixer up-converts the signals to a radio frequency, ranging from several hundred MHz to several hundred GHz, before being sent, and down-converts from the radio frequency to intermediate frequency (IF) upon receipt. A RF mixer is a three-port passive or active device, which has IF or RF input, LO input, and RF or IF output.

SUMMARY

According to one or more embodiments, a commutating circuit comprises a single-ended mixer comprising a differential local oscillator terminal; and a passive network comprising a plurality of inductors and a capacitor, wherein the plurality of inductors is coupled to the differential local oscillator terminal and provides an impedance in accordance with a common mode or a differential mode. According to other embodiments, the commutating circuit can be implemented as device, a system and/or a method.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

Figure 1:
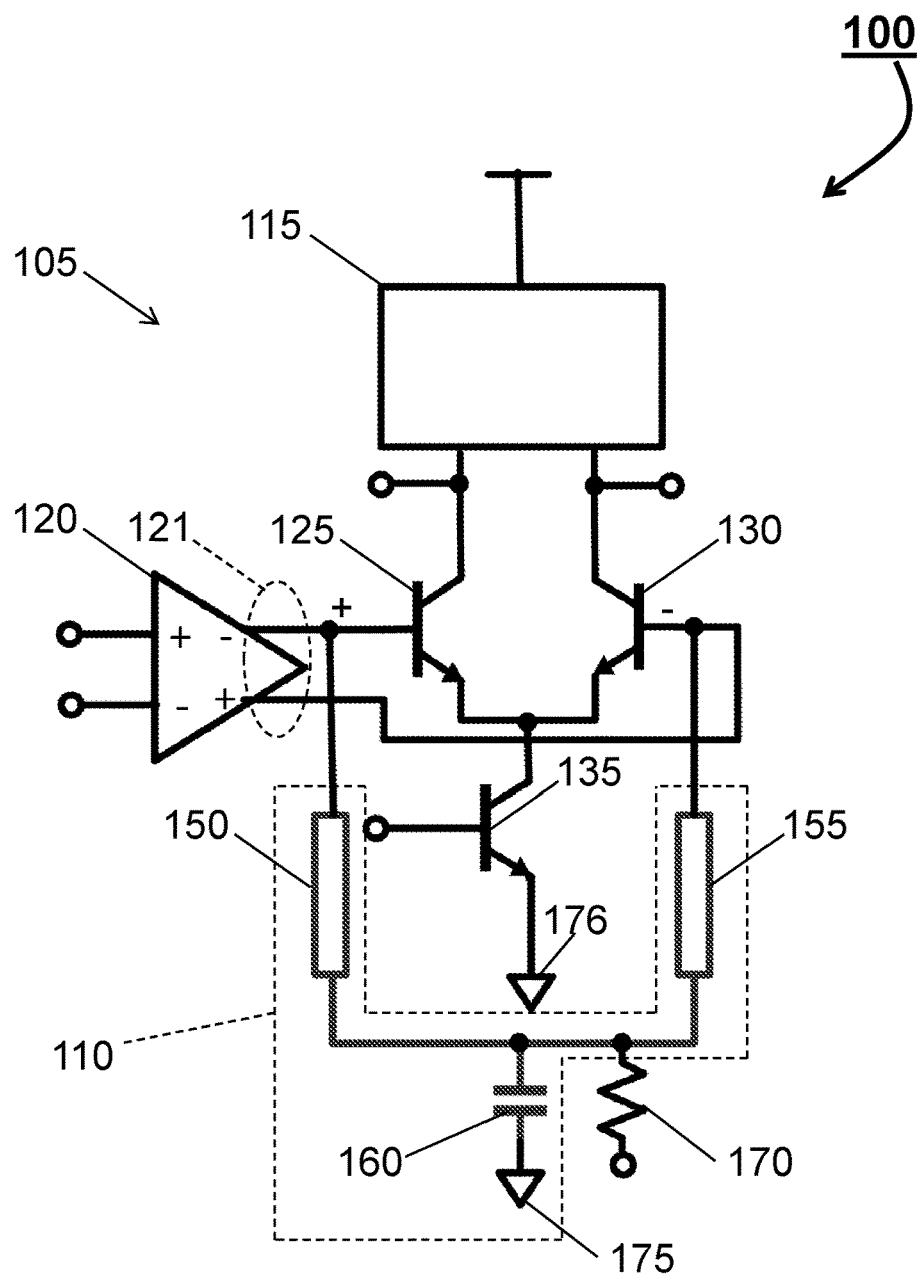
FIG. 1 illustrates a schematic of a commutating circuit comprising a single-ended mixer and a passive network in accordance with one or more embodiments.

Various embodiments of the present disclosure are described herein with reference to the related drawings. Alternate embodiments may be devised without departing from the scope of this disclosure. It is noted that various connections are set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

In communications and electronic engineering, an intermediate frequency (IF) is a frequency to which a radio-frequency (RF) is shifted down as an intermediate step in a heterodyne receiver. Conversion gain i is generally the ratio of the IF output power to the available RF source power. When a RF frequency is very high in a millimeter-wave regime (e.g. 90 GHz) and is down-converted to an IF frequency (e.g. 10 GHz), it is difficult to achieve sufficient conversion gain because of the fundamental limitation of the maximum operation frequency of transistors and parasitic components. For example, contemporary single-ended mixers include a pair of switching devices (e.g., transistors), a trans-conductance device, and a local oscillator (LO) buffer. Due to a finite common mode output impedance of the LO buffer, the contemporary single-ended mixers experience a conversion gain degradation. In other words, in a common mode view of a contemporary single-ended mixer, a finite common mode output impedance of the LO buffer reduces a current flow from the trans-conductance device into the pair of switching devices, thereby decreasing the conversion gain.

The disclosure herein relates generally to using common mode LO termination in single-ended commutating circuits for conversion gain improvement. According to one or more embodiments, a commutating circuit comprises a single-ended mixer and a passive network. The single-ended mixer comprises a differential LO terminal, which can be referred to as a differential LO input. The single-ended mixer generally is a frequency conversion circuit.

The passive network comprises a plurality of inductors (e.g., a first inductor and a second inductor) and a capacitor. The passive network can be formed with the capacitor in a middle of the first inductor and the second inductor. In one or more embodiments, a first terminal of the capacitor is coupled to each of the inductors and a second end of the capacitor is coupled to a signal ground. The passive network does not require any extra power as it does not include a resistor consumption. The first inductor and the second inductor can be coupled to the differential LO input. The first inductor and the second inductor can provide an impedance in accordance with a common mode, such as an RF input signal, or a differential mode, such as a LO input signal.

The capacitor can be shunt capacitor. The shunt capacitor and plurality of inductors improve conversion gain without extra power consumption.

The passive network can also be a reactive passive network. The reactive portion of the reactive passive network refers to the reactive passive network including the inductors and capacitor, but not a resistor. Further, the reactive passive network can be a shunt reactive passive network when the capacitor is a shunt capacitor (and as the inductor and capacitors are reactive, they do not add noise into the system).

The passive network can be absorbed into a matching network of the commutating circuit for a differential local oscillator input signal for the maximum power transfer from the output of LO buffer to the switching pair. On the other hand, the passive network provides a very small impedance (close to ac-short) through series resonance for the common mode at the RF frequency. Also, when a single LO buffer drives multiple mixers (e.g., single-ended mixers), the passive network can reduce crosstalk between the multiple mixers by isolating each mixer. For instance, when the multiple mixers utilize shared LO input nodes, the passive network associated with one mixer rejects signals at the RF frequency from other mixers (thereby isolating the one mixer).

In a common mode view of a contemporary single-ended mixer, a finite output impedance of the LO buffer reduces an alternating current (AC) voltage swing across base and emitter (or gate and source in metal-oxide-semiconductor field-effect transistor) of the switching bipolar junction transistor devices and also decreases a radio frequency current that flows into the pair of switching devices, thereby decreasing the conversion gain. In operation, the commutating circuit maximizes the conversion gain by minimizing a common mode output impedance of the LO buffer at specific radio frequency currents (without affecting the LO buffer output impedance for differential LO signal).

Turning now to FIG. 1, a schematic of a commutating circuit 100 comprising a single-ended mixer 105 and a passive network 110 is illustrated in accordance with one or more embodiments. The single-ended mixer 105 comprises a load 115, a LO buffer 120, a differential LO input 121, a first switching device 125, a second switching device 130, and a trans-conductance device 135, configured and arranged as shown. Note that the first and second switching devices 125 and 130 can be referred to as a switching pair. The passive network 110 includes a first inductor 150, a second inductor 155, and a capacitor 160. The commutating circuit 100 also includes a resistor 170 and one or more signal grounds 175 and 176. The single-ended mixer 105 operates by switching, via the switching devices 125 and 130, an input signal current being passed through the trans-conductance device 135 (inverted or non-inverted) according to a phase of the LO buffer 120.

The passive network 110 can operate in different modes so as to provide proper impedance. For instance, the passive network 110 can operate in a common mode for RF signal current generated from a trans-conductance device 135 and split equally into the two switching devices 125 and 130. The passive network 110 can also operate in a differential mode when the differential LO input 121 (e.g., differential LO terminal) is providing from the LO buffer 120 to the switching devices 125 and 130. The common mode is when the outputs of the LO buffer 120 are in a common phase (e.g., LO+ and LO− are moving together). The differential mode is when the outputs of the LO buffer 120 are in opposite phases (e.g., LO+ and LO− are moving opposite directions). Note that a first terminal of the capacitor 160 is coupled to each of the first and second inductors 150 and 155 and a second end of the capacitor 160 is coupled to the signal ground 175.

Figure 2:
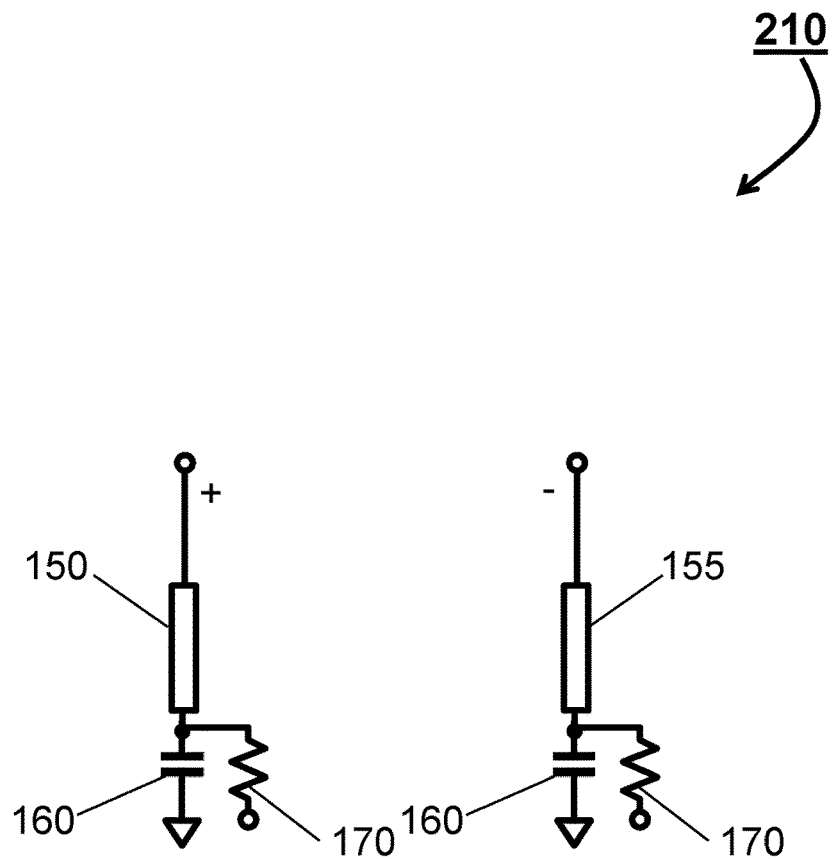
FIG. 2 illustrates an operative schematic of a passive network for a common mode impedance in accordance with one or more embodiments.

In view of the above, the passive network 110 will now be described with reference to FIGS. 2 and 3. FIG. 2 illustrates an operative schematic 210 of a passive network 110 of FIG. 1 in accordance with one or more embodiments. The operative schematic 210 shows an electrical structure of the passive network 110 of FIG. 1 in accordance with the first and second inductors 150 and 155 receiving a common mode, such as a RF input signal. In turn, the first and second inductors 150 and 155 can provide an impedance through series resonance for the common mode. In other words, to maximize a RF current flow into the switching devices (e.g., the first and second switching devices 125 and 130 of FIG. 1), an LO port is shorted in a common mode at an RF frequency using series resonance between the second inductors 150 and 155 and the capacitor 160.

Figure 3:
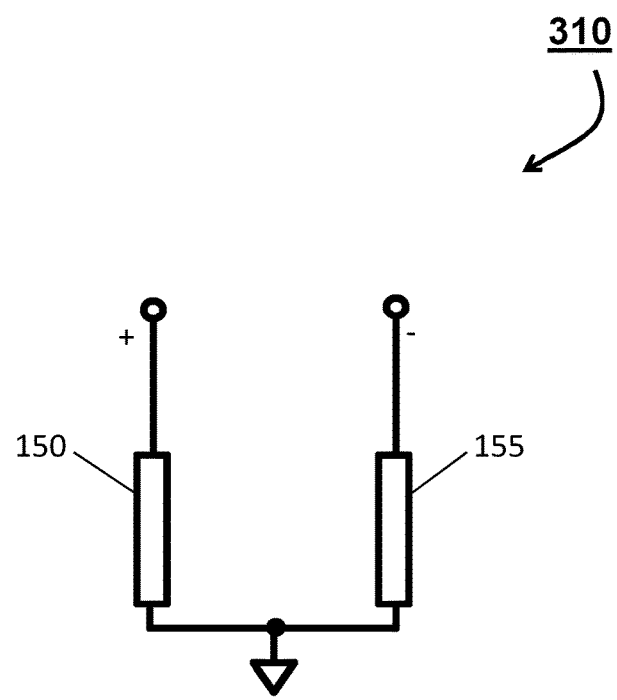
FIG. 3 illustrates an operative schematic of a passive network for a differential mode impedance in accordance with one or more embodiment.

FIG. 3 illustrates an operative schematic 310 of a passive network 110 of FIG. 1 in accordance with one or more embodiments. The operative schematic 310 shows an electrical structure of the passive network 110 of FIG. 1 in accordance with the first and second inductors 150 and 155 receiving a differential mode, such as a LO input signal. The proposed network 110 can also be utilized as a part of a LO matching circuit to maximize LO swing (or maximize a LO power transfer to switching devices). Further, an input capacitive impedance of switching devices (e.g., the first and second switching devices 125 and 130 of FIG. 1) can be tuned out by the second inductors 150 and 155.

Figure 4:
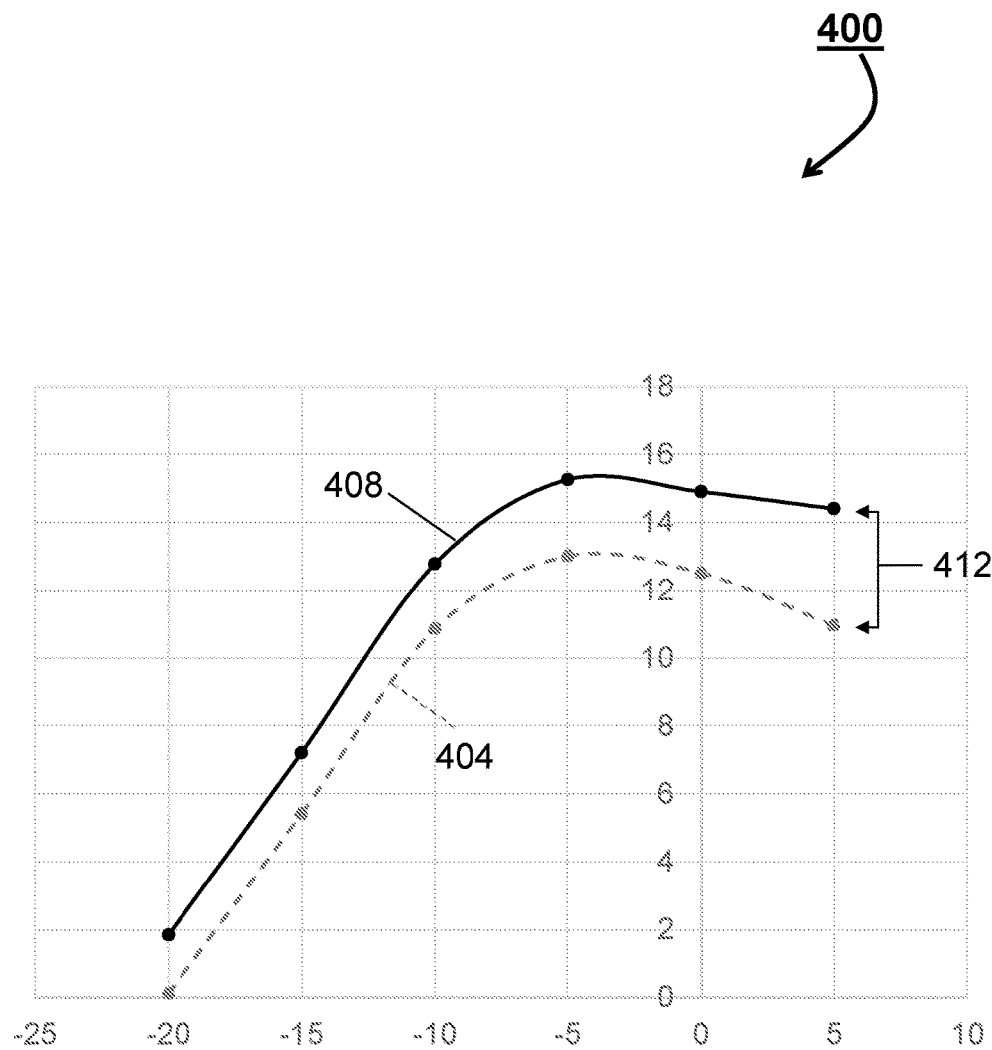
FIG. 4 illustrates a graph simulating the conversion gain of a commutating circuit in accordance with one or more embodiments.

FIG. 4 illustrates a graph 400 simulating the conversion gain of a commutating circuit in accordance with one or more embodiments. The graph includes an x-axis illustrating a LO power (dBm) and a y-axis illustrating a conversion gain (dB). Further, given the operating condition of the commutating circuit of a LO frequency being equal to 84 GHz and the radio frequency being equal to 95 GHz, two plots are estimated in the graph 400. A first plot 404 illustrates the commutating circuit operating without a common mode termination. A second plot 408 illustrates the commutating circuit operating without a common mode termination. Note that, with the common mode termination, the commutating circuit includes an improved conversion gain 412 (shown as approximately 3.4 dB).

Figure 5:
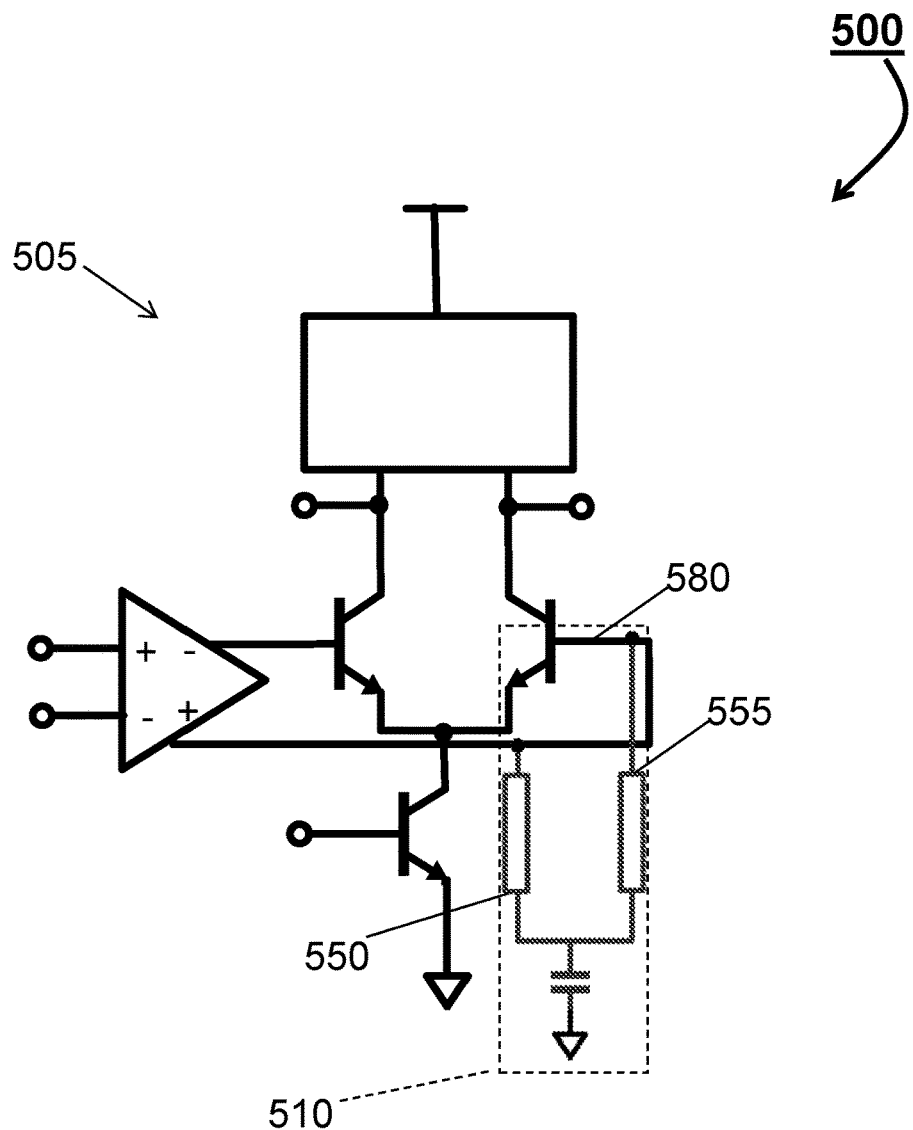
FIG. 5 illustrates a schematic of a binary phase-shift keying modulator coupled to a passive network in accordance with one or more embodiments.

In view of the above, example implementations of the commutating circuit will now be described with reference to FIGS. 5, 6 and 7. FIG. 5 illustrates a schematic 500 of a binary phase-shift keying modulator 505 coupled to a passive network 510 in accordance with one or more embodiments. As shown, the passive network 510 includes first and second inductors 550 and 555 coupled to a single LO input 580 of a switching device of the binary phase-shift keying modulator 505.

Figure 6:
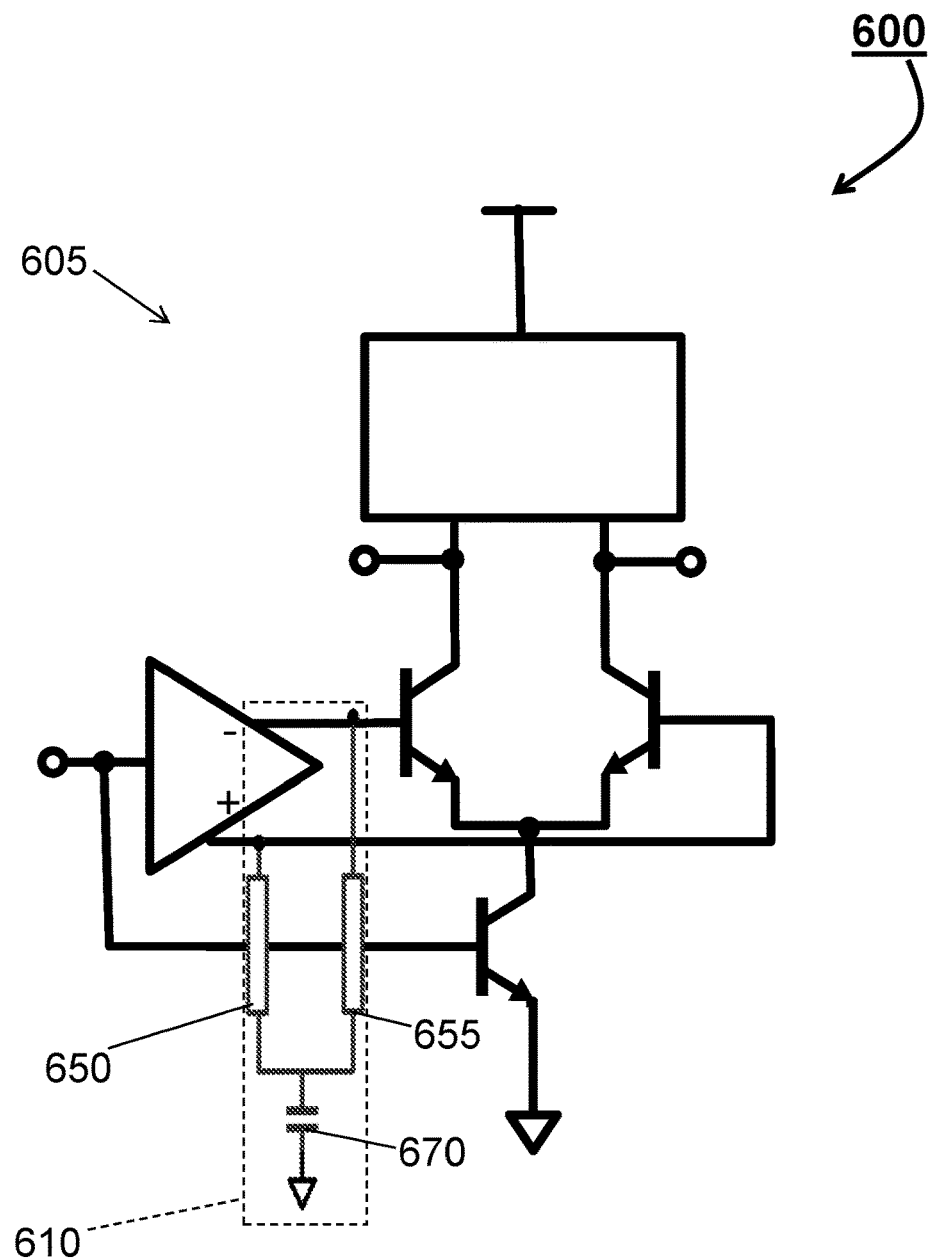
FIG. 6 illustrates a schematic of a frequency doubler coupled to a passive network in accordance with one or more embodiments.

FIG. 6 illustrates a schematic 600 of a frequency doubler 605 coupled to a passive network 610 in accordance with one or more embodiments. As shown, the passive network 610 includes a first inductor 650 coupled to a positive output of an LO buffer of the frequency doubler 605 and a second inductor 655 coupled to a negative output of the LO buffer.

Figure 7:
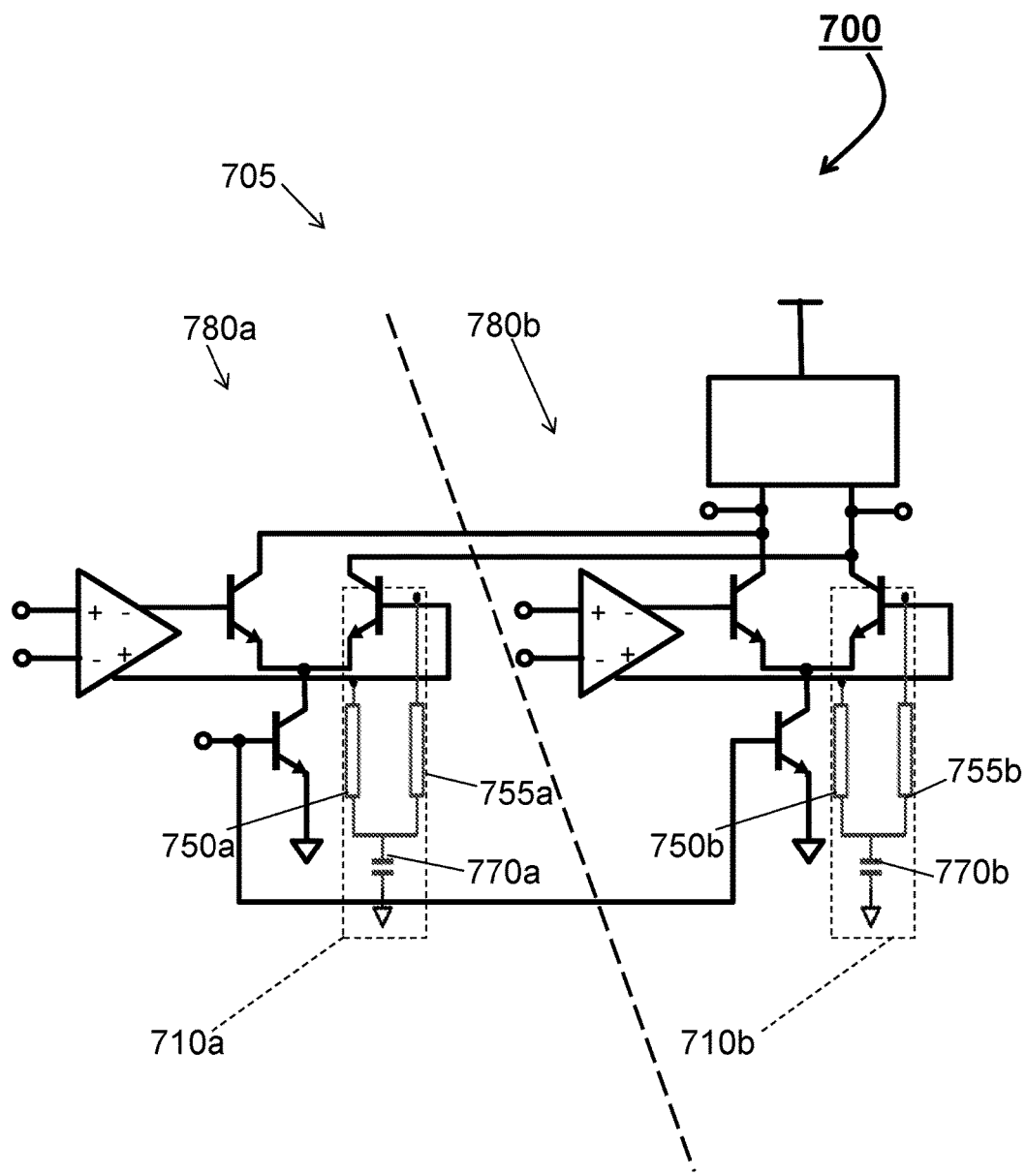
FIG. 7 illustrates a schematic of a quadrature phase shift keying modulator circuit coupled to a passive network in accordance with one or more embodiments.

FIG. 7 illustrates a schematic 700 of a quadrature phase shift keying (QPSK) modulator circuit 705 coupled to a plurality of passive networks (e.g., a passive network 710a and a passive network 710b) in accordance with one or more embodiments. As shown, the passive network 710a includes first and second inductors 750a and 755a coupled to a single LO input of a switching device of a first sub-circuit 780a of the QPSK modulator circuit 705. Further, the passive network 710b includes first and second inductors 750b and 755b coupled to a single LO input of a switching device of a second sub-circuit 780b of the QPSK modulator circuit 705.

The technical effects and benefits of embodiments of the disclosed passive network include improving a conversion gain without extra power consumption and improving a conversion gain compression at high LO power (e.g., conversion gain drop at high LO is smaller with the resonant network). The technical effects and benefits of embodiments of the disclosed passive network include a small chip area, as an inductive portion of communicating circuits can be adapted for local oscillator matching, thereby requiring only an addition of the capacitor. Further, when multiple mixers are driven by a single LO buffer, the technical effects and benefits of embodiments of the passive network include improving isolation among RF signals. Furthermore, when an imperfect LO signal is input, the technical effects and benefits of embodiments of the passive network include a filtering of the common mode signal by the passive network to shape the local oscillator as more differential.

The flowchart and block diagrams in the Figures illustrate the architecture, functionality, and operation of possible implementations of systems and/or methods according to various embodiments herein. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A commutating circuit, comprising:
   a single-ended mixer comprising a differential local oscillator terminal; and
   a passive network comprising a plurality of inductors and a capacitor;
   wherein the plurality of inductors is coupled to the differential local oscillator terminal and provides an impedance in accordance with a common mode or a differential mode.

2. The commutating circuit of claim 1, wherein the plurality of inductors include first and second inductors.

3. The commutating circuit of claim 2, wherein the passive network is formed with a first terminal of the capacitor coupled to each of the plurality of inductors and a second end of the capacitor coupled to a signal ground.

4. The commutating circuit of claim 1, wherein the capacitor comprises a shunt capacitor.

5. The commutating circuit of claim 1, wherein the passive network comprises a reactive passive network.

6. The commutating circuit of claim 1, wherein the passive network is included in a matching network of the commutating circuit for a differential local oscillator input signal.

7. The commutating circuit of claim 1, wherein the single-ended mixer comprises a binary phase-shift keying modulator.

8. The commutating circuit of claim 1, wherein the single-ended mixer comprises a quadrature phase-shift keying modulator.

9. The commutating circuit of claim 1, wherein the single-ended mixer comprises a doubler circuit.

10. A device, comprising:
    a commutating circuit comprising:
    a single-ended mixer comprising a differential local oscillator terminal; and
    a passive network comprising a plurality of inductors and a capacitor,
    wherein the plurality of inductors is coupled to the differential local oscillator terminal and provides an impedance in accordance with a common mode or a differential mode.

11. The device of claim 10, wherein the plurality of inductors include first and second inductors.

12. The device of claim 11, wherein the passive network is formed with a first terminal of the capacitor coupled to each of the plurality of inductors and a second end of the capacitor coupled to a signal ground.

13. The device of claim 10, wherein the capacitor comprises a shunt capacitor.

14. The device of claim 10, wherein the passive network comprises a reactive passive network.

15. The device of claim 10, wherein the passive network is included in a matching network of the commutating circuit for a differential local oscillator input signal.

16. A method of improving a conversion gain of a commutating device comprising a single-ended mixer comprising a differential local oscillator terminal, the method comprising:
    receiving an input signal from a local oscillator buffer of the commutating device by a pair of switching devices of the commutating device; and
    providing an impedance in accordance with the input signal by a plurality of inductors of a passive network to improve the conversion gain of the commutating device, the plurality of inductors being coupled to the differential local oscillator terminal,
    wherein the input signal comprises a common mode input signal or a differential mode.

17. The method of claim 16, wherein one of the plurality of inductors tunes out an input capacitive impedance of the pair of switching devices.

\* \* \* \* \*